United States Patent [19]

Van Hove et al.

[11] Patent Number: 5,278,435

[45] Date of Patent: Jan. 11, 1994

[54] HIGH RESPONSIVITY ULTRAVIOLET GALLIUM NITRIDE DETECTOR

[75] Inventors: James M. Van Hove, Eagan; Jon N. Kuznia, Bloomington; Donald T. Olson, Roseville; Muhammad A. Kahn, White Bear Lake; Margaret C. Blasingame, Moundsview, all of Minn.

[73] Assignee: APA Optics, Inc., Blaine, Minn.

[21] Appl. No.: 895,350

[22] Filed: Jun. 8, 1992

[51] Int. Cl.$^5$ .......................................... H01L 27/14
[52] U.S. Cl. ................................... 257/184; 257/201; 257/453; 257/441; 437/5
[58] Field of Search ............... 257/184, 185, 200, 201, 257/428, 431, 453, 76, 486, 441; 250/370.01, 370.12, 372; 437/3, 5

[56] References Cited

U.S. PATENT DOCUMENTS

| | | | |
|---|---|---|---|
| 4,300,811 | 11/1981 | Ettenberg et al. | 350/1.1 |
| 4,368,098 | 1/1983 | Manasevit | 156/606 |
| 4,404,265 | 9/1983 | Manasevit | 428/689 |
| 4,614,961 | 9/1986 | Khan et al. | 357/30 |
| 4,616,248 | 10/1986 | Khan et al. | 357/30 |
| 4,666,250 | 5/1987 | Southwell | 350/166 |
| 4,999,842 | 3/1991 | Huang et al. | 372/45 |
| 5,005,057 | 4/1991 | Izumiya | 357/17 |
| 5,012,486 | 4/1991 | Luryi et al. | 372/45 |
| 5,052,008 | 9/1991 | Kemeny | 372/45 |

FOREIGN PATENT DOCUMENTS

| | | | |
|---|---|---|---|
| 0177918 | 4/1986 | European Pat. Off. | 257/185 |
| 61-8980 | 1/1986 | Japan | 257/185 |

OTHER PUBLICATIONS

Khan et al., "Atomic Layer Epitaxy of GaN Over Sapphire Using Switched Metalorganic Chemical Vapor Deposition," *Appl. Phys. Lett.*, 60(11), 16 Mar. 1992, pp. 1366–1368.

"High-Efficiency (1.2mW/mA) Top-Surface-Emitting GaAs Quantum Well Lasers at 850 nm," Lee et al., IEEE Photonics Technology Letters, vol. 2, No. 9, pp. 685–688, Sep. 9, 1990.

"Photoluminescence Characteristics of Al- GaN-GaN-AlGaN Quantum Wells," Khan et al., Appl. Phys. Lett., vol. 56, No. 13, pp. 1257–1259, Mar. 1990.

"Properties and Ion Implantation of $Al_xGa_{1-x}N$ Epitaxial Single Crystal Films Prepared by Low Pressure Metalorganic Chemical Vapor Deposition," Khan et al., Appl. Phys. Lett., vol. 43, No. 5, pp. 492–494, Sep. 1, 1983.

"Electrical Properties and Ion Implantation of Epitaxial GaN, Grown by Low Pressure Metalorganic Chemical Vapor Deposition," Khan et al., Appl. Phys. Lett., vol. 42, No. 5, pp. 430–432, Mar. 1, 1983.

"Properties of Zn-doped VPE-Grown GaN. 1. Luminescence Data in Relation to Doping Conditions," Monemar et al., Journal of Applied Physics, vol. 51, No. 1, pp. 625–639, Jan. 1980.

"Epitaxial Growth of GaN/AlN Heterostructures," Yoshida et al., Journal of Vacuum Science Technology, vol. 1, No. 2, pp. 250–253, Apr.–Jun. 1983.

"P-Type Conduction in Mg-Doped GaN Treated with Low-Energy Electron Beam Irradiation (LEEBI)," Amano et al., Japanese Journal of Applied Physics, vol. 28, No. 12, pp. L2112–L2114, Dec. 1989.

"Effects of the Buffer Layer in Metalorganic Vapour Phase Epitaxy of GaN on Sapphire Substrate," Amano et al., Thin Solid Films, 163, pp. 414–421, 1988.

(List continued on next page.)

*Primary Examiner*—William Mintel
*Attorney, Agent, or Firm*—Merchant, Gould, Smith, Edell, Welter & Schmidt

[57] ABSTRACT

The invention is an $Al_xGa_{1-x}N$ ultraviolet detector with extremely high responsivity at over 200 to 365 nanometers and a very sharp long wavelength cutoff. The active layer for the sensors is a single crystal $Al_xGa_{1-x}N$ preferably deposited over a basal plane sapphire substrate using a switched atomic layer epitaxy process.

8 Claims, 8 Drawing Sheets

OTHER PUBLICATIONS

"Stimulated Emission Near Ultraviolet at Room Temperature from a GaN Film Grown on Sapphire by MOVPE Using an AlN Buffer Layer," Amano et al., Japanese Journal of Applied Physics, vol. 29, No. 2, pp. L205-L206, Feb. 1990.

"Improvements on the Electrical and Luminescent Properties of Reactive Molecular Beam Epitaxially Grown GaN Films by Using AlN-Coated Sapphire Substrates," Yoshida et al., Appl. Phys. Lett., vol. 42, No. 5, pp. 427-429, Mar. 1, 1983.

"Growth of High Optical and Electrical Quality GaN Layers Using Low-Pressure Metalorganic Chemical Vapor Deposition," Khan et al., Appl. Phys. Lett., vol. 58, No. 5, pp. 526-527, Feb. 4, 1991.

"Vertical-Cavity, Room-Temperature Stimulated Emission From Photopumped GaN Films Deposited Over Sapphire Substrates Using Low-Pressure Metalorganic Chemical Vapor Deposition," Khan et al., Appl. Phys. Lett., vol. 58, No. 14 pp. 1515-1517, Apr. 8, 1991.

"High Electron Mobility GaN/Al$_x$Ga$_{1-x}$N Heterostructures Grown by Low-Pressure Metalorganic Chemical Vapor Deposition," Khan et al., Appl. Phys. Lett., vol. 58, No. 21, pp. 2408-2410, May 27, 1991.

"Novel Metalorganic Chemical Vapor Deposition System for GaN Growth," Nakamura et al., Appl. Phys. Lett., vol. 58, No. 18, pp. 2021-2023, May 6, 1991.

"Trends in Materials, Diminishing Dimensions," E. Corcoran, Scientific American, pp. 124-131, Nov. 1990.

HIGH RESPONSIVITY ULTRAVIOLET GALLIUM NITRIDE DETECTOR

FIELD OF THE INVENTION

The invention generally relates to aluminum gallium nitride ultraviolet detectors. More specifically, the invention relates to ultraviolet aluminum gallium nitride detectors formed through a switched atomic layer epitaxy process.

BACKGROUND OF THE INVENTION $Al_xga_{1-}N$ is a compound semiconductor that is ideally suited for devices in the visible and the ultraviolet parts of the spectrum. Its band gap is tunable from 365 nanometers (at $x=0$) to 200 nanometers (at $x=1$) and is direct over the entire alloy composition. This makes the material ideally suited for intrinsic ultraviolet sensors with responsivities sharply peaked at a wavelength corresponding to the band edge. Such sensors have potential commercial applications in the areas of flame safeguard and fire control.

Ultraviolet detectors and, specifically, detectors of gallium nitride are well known in the art. For example, Khan et al, U.S. Pat. Nos. 4,614,961 and 4,616,248, disclose gallium nitride devices. One device is an ultraviolet detector comprising a sapphire base, an aluminum nitride matrix matching layer, and an aluminum gallium nitride active layer. However, made by conventional metal organic chemical vapor deposition (MOCVD), the disclosed device has a peak sensor responsivity at 365 nanometers. The device generally does not provide a broad response across the expanse of the ultraviolet range.

Others have deposited gallium nitride layers over basal plane sapphire substrates using metal organic chemical vapor deposition; see Khan et al, Applied Physics Letters, 58, 526 (1991); Amano et al, Japanese Journal of Applied Physics, 29, L205 (1990); and Nakamura et al, Applied Physics Letters, 58, 2021 (1991).

The deposition of various aluminum gallium nitride layers in various temperature environments has also been well documented, see Khan et al, Applied Physics Letters, 58, 1515 (1991); Khan et al Applied Physics Letters, 58, 2408 (1991); Khan et al, Applied Physics Letters, 60 (11), 1366 (1992); and Khan et al, Applied Physics Letters, 56, 1257 (1990).

However, no prior art gallium nitride ultraviolet device has provided a detector having the level or range of responsivity necessary to provide sensitivity over the broad ultraviolet range while still avoiding interferences created by visible and infrared wavelengths.

SUMMARY OF THE INVENTION

In accordance with a first aspect of the invention, there is provided an ultraviolet detector having a single crystal substrate and a single crystal active layer of aluminum gallium nitride ($Al_xGa_{1-x}N$ wherein $x=0$ to 1) wherein the ultraviolet detector has a peak sensor responsivity at 365 nanometers which is $0.2 \times 10^6$ amps per watt (when $x=0$) and a substantially constant responsivity for ultraviolet wavelengths ranging from about 200 to 365 nanometers.

In accordance with a second aspect of the invention, there is provided an ultraviolet detector having a single crystal substrate, a matrix layer deposited over the single crystal substrate, and an active layer deposited over the matrix layer, said active layer comprising single crystal aluminum gallium nitride ($Al_xGa_{1-x}N$ wherein $x=0$ to 1) wherein the single crystal aluminum gallium nitride active layer is deposited through atomic layer epitaxy.

Preferably, the invention also comprises a metallizing layer which serves as an electrode deposited over the single crystal AlGaN layer. Using an interdigitated electrode pattern with a 10 micron spacing deposited over the AlGaN, the sensor responsivity at 365 nanometers of the claimed detector may be $0.2 \times 10^6$ A/W with a bias of 5 volts when the molar concentration of Al is 0 mol-%. The claimed detector has a responsivity which is nearly constant for wavelengths from 200 to 365 nanometers and it drops by three orders of magnitude by 375 nanometers (within 10 nanometers of the band edge).

DETAILED DESCRIPTION OF THE INVENTION

The invention comprises an ultraviolet aluminum gallium nitride detector. The detector generally has two layers including a substrate layer and an aluminum gallium nitride layer. Preferably, the detector may also comprise a crystal match or matrix layer between the substrate and the active aluminum gallium nitride layer.

The AlGaN Ultraviolet Detector

Figure 1A:
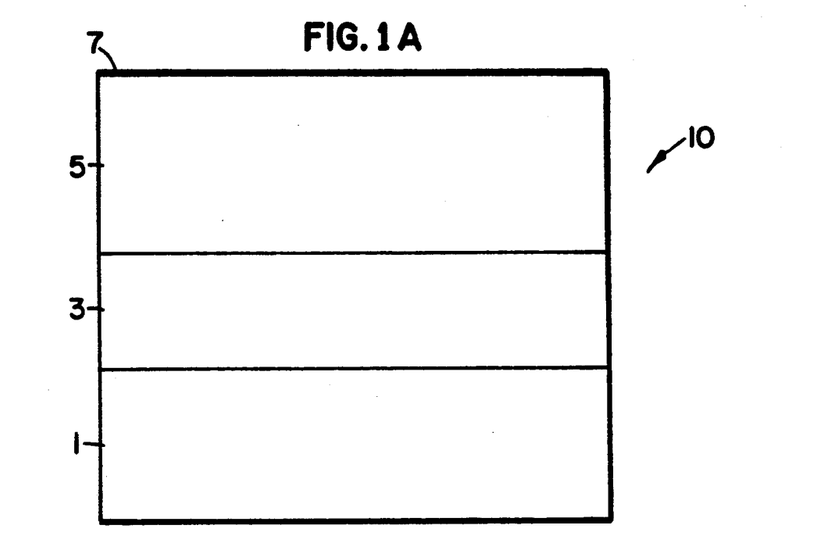
FIGS. 1A and 1B are a schematic depiction of two embodiments of the ultraviolet detector of the invention.
Figure 1B:
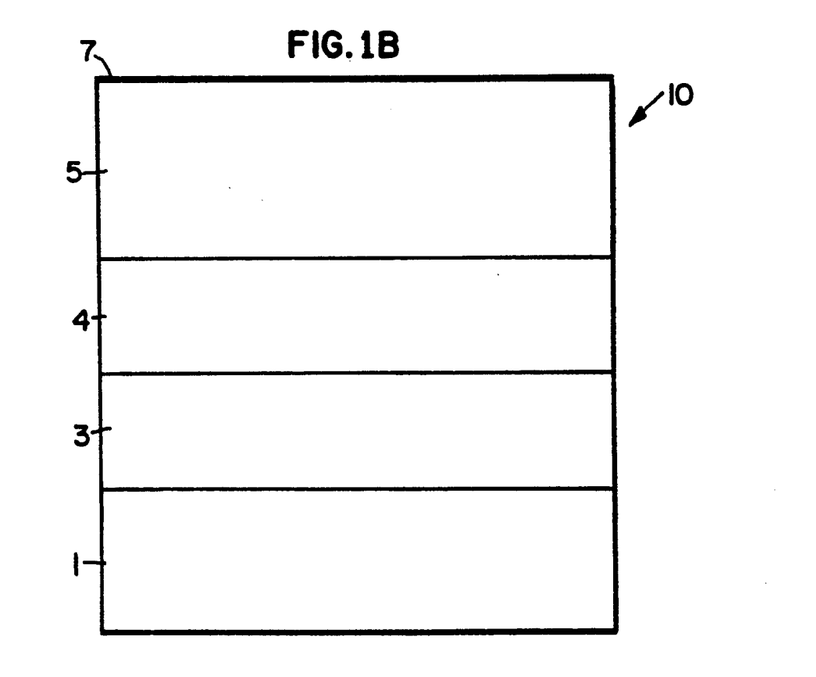

Referring to the drawings wherein like numerals represent like parts throughout several views, there is generally shown an AlGaN ultraviolet (UV) detector in FIGS. 1A and 1B. In its broadest scope the UV detector of the invention can be seen in FIG. 1A. In this instance the detector comprises a single crystal substrate 1, a matrix layer 3, the single crystal AlGaN active layer 5, and a metallization layer 7 which serves as an electrode for the device. In a more preferred aspect (FIG. 1B), the device comprises a preliminary layer of AlGaN 4 deposited over the matrix layer 3 to function as a seed for the AlGaN active layer 5.

Generally, the first layer of the ultraviolet detector is a substrate 1. The substrate functions as a seed for the growth of further layers of the detector as well as a physical support for the detector. Any number of compositions may be used including gallium arsenide, silicon, silicon carbide, zinc oxide, magnesium oxide, germanium, and spinnel quartz among others. Preferably, sapphire, and most specifically, single crystal basal plane sapphire is used as the substrate. Basal plane sapphire is commercially available in single crystal form and serves well as a template for the growth of further layers of the detector. Further, basal plane sapphire is generally transparent to ultraviolet energy. Basal plane sapphire is commercially available through any number of channels.

In order to ease the lattice mismatch between single crystal aluminum gallium nitride and the substrate, the ultraviolet detector of the invention may also comprise an intermediate matrix layer 3. Generally, any number of chemical compositions may be used for such a layer consistent with the function of this layer such as gallium nitride, boron nitride, zinc oxide, magnesium oxide and aluminum nitride among others.

A preliminary layer of aluminum gallium nitride may then be deposited over the substrate 1 and, if present, matrix layer 3. This aluminum gallium nitride layer 4 (FIG. 1B) serves as a substrate for the active aluminum gallium nitride layer 5 which is later deposited by atomic layer epitaxy. Generally, the aluminum gallium nitride layer may range in thickness generally from about 100 Å to 1000 Å, preferably from about 400 Å to about 600 Å, and most preferably is about 500 Å thick.

The ultraviolet detector of the invention also comprises an aluminum gallium nitride active layer 5. The function of this aluminum gallium nitride active layer is to absorb and collect ultraviolet signals at a high responsivity rate. Preferably, the aluminum gallium nitride layer is single crystal and from about 4000 Å to about 20,000 Å, preferably from about 4000 Å to 10,000 Å, and most preferably about 5000 Å. If the single crystal active aluminum gallium nitride layer is too thin, it will not absorb all the ultraviolet signals incident on the detector. Further, if the aluminum gallium nitride single crystal active layer is too thick, the detector will be unable to collect enough ultraviolet energy to drive or create a response.

In one preferred aspect, the invention comprises a 0.8 micron thick active layer of GaN deposited over a 0.1 micron thick AlN buffer layer. Prior to detector fabrication, the epilayer structure was characterized for its optical transmission and photoluminescence.

Figure 2A:
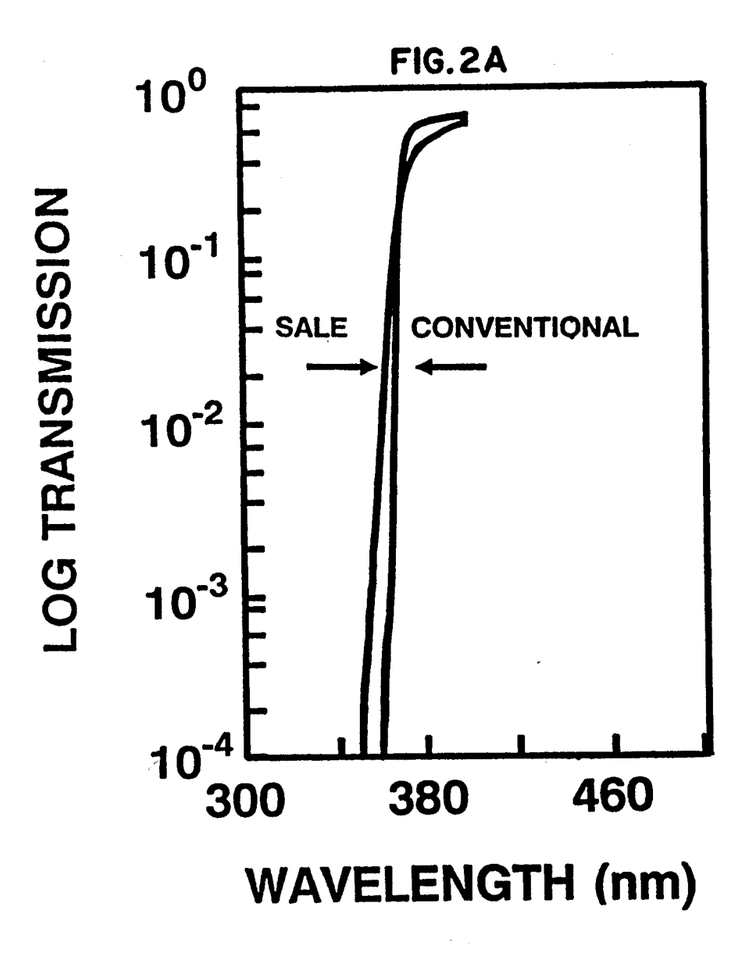
FIGS. 2A and 2B are graphical depictions of the optical transmission and photoluminescence of the detector of the invention compared to prior art detectors.
Figure 2B:
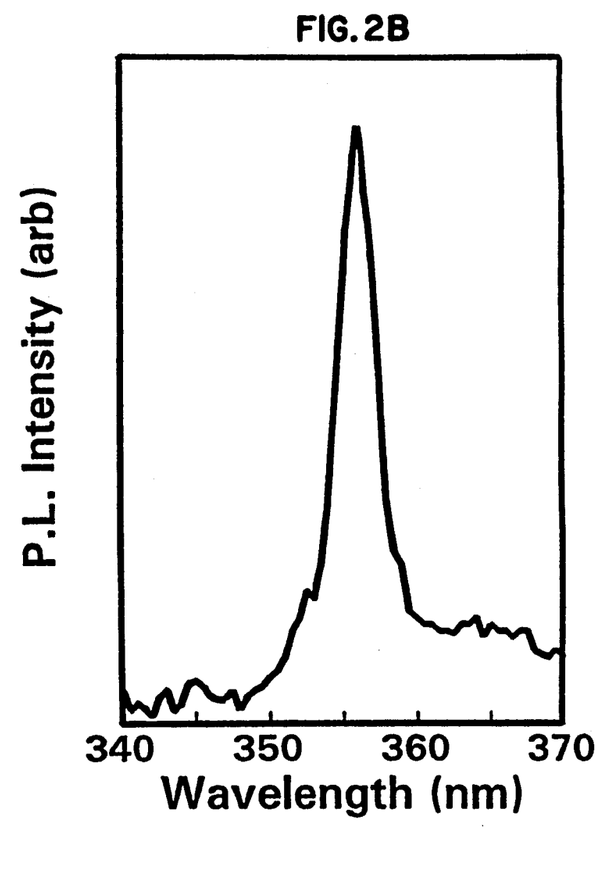

In FIG. 2A, the optical transmissivity of the atomic layer epitaxy material (SALE) is comparable to conventional MOCVD material (conventional). In FIG. 2B, the photoluminescence versus wavelength spectrum from atomic layer epitaxy GaN layer shows excellent responsivity by the peak with narrow peak half-width.

Figure 3:
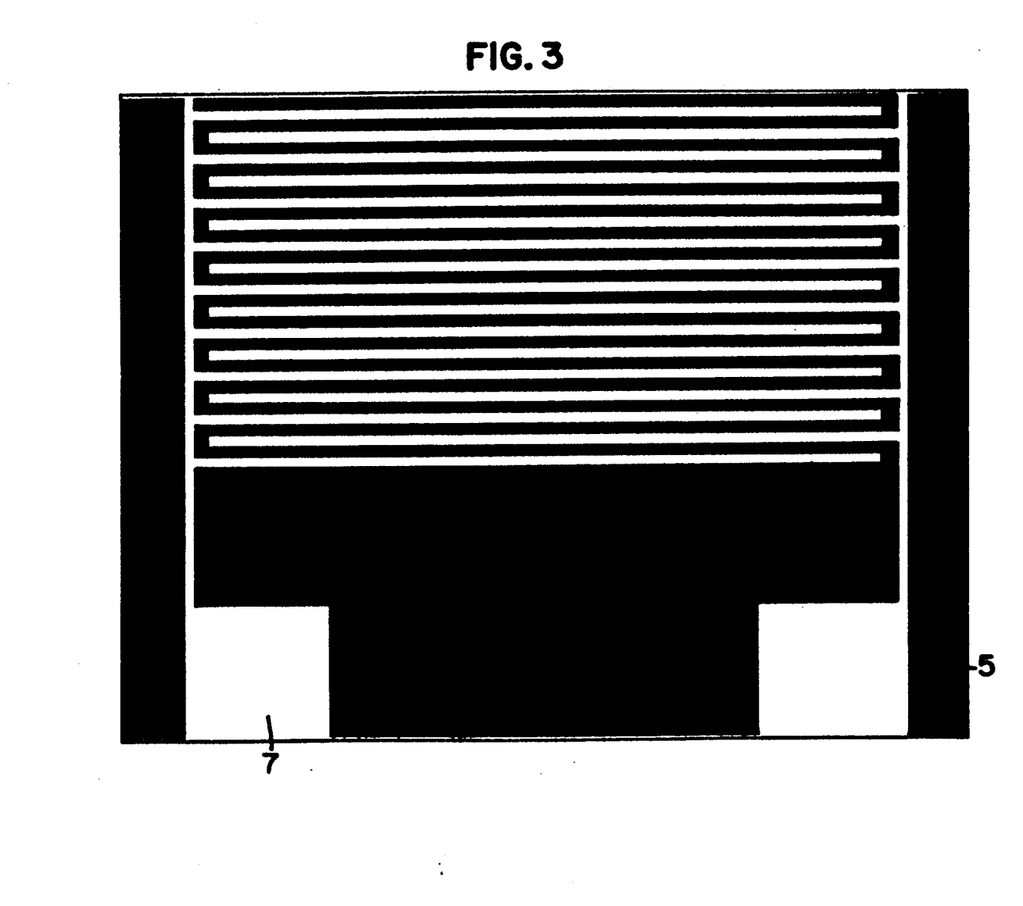
FIG. 3 is a top plan view of the detector shown in FIGS. 1A and 1B.

The UV detector of the invention may also comprise an electrode system 7 (FIGS. 1A, 1B and 3). The electrode system serves to sense changes in the AlGaN active layer 5 created by the UV energy, incident to the detector, and transmit these changes to a sensing circuit. Generally, any number of materials may be used consistent with these functions. One means of defining an electrode system is through conventional metallization and photolithography processes. Metals used for the electrode include aluminum, tungsten, silver, copper, gold, titanium and any number of other conductive metals. One preferred combination comprises an initial layer of titanium followed by gold patterned as interdigitated fingers (FIG. 3).

Using photolithography procedures, the interdigitated electrodes may be formed on the epilayers, FIG. 3. Generally, a liftoff process may be used to form 5000 Å thick gold electrodes. Preferably, the fabricated detector structure may occupy an area of 0.75 mm$^2$ and the interdigitated electrodes may be formed 3 microns wide, 1 mm long and with 10 micron spacing.

Figure 4A:
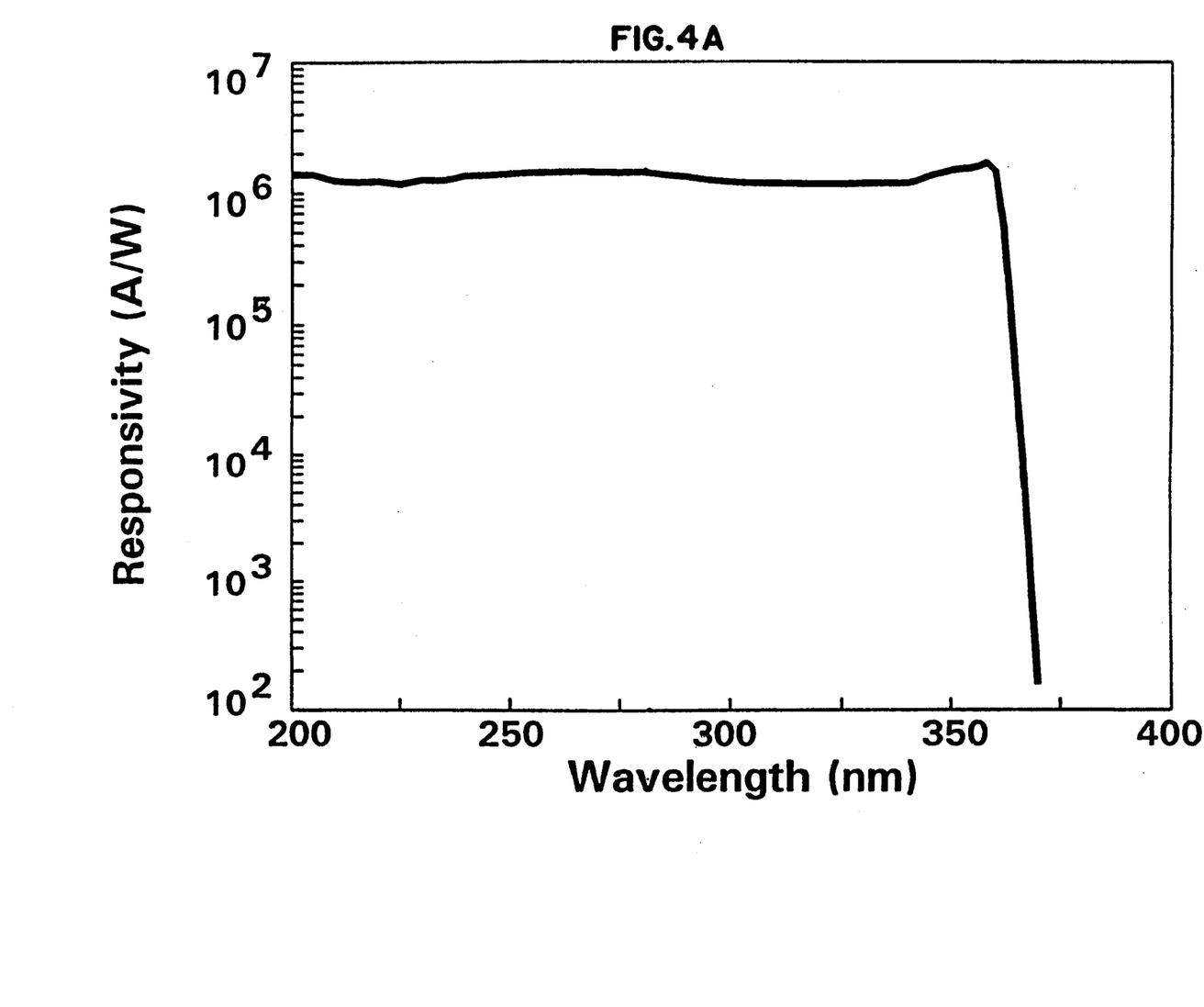
FIG. 4A is a graphical depiction of the spectral responsivity of the ultraviolet detector of the invention.

By measurement of the current voltage characteristics of the device with the intensity of the source normalized to allow for the varying emission intensity at different wavelengths, spectral responsivity data for a single (GaN) detector element may be seen in FIG. 4. As seen, the spectral responsivity is beyond the signal detection limit for wavelengths in excess of 375 nanometers. It reaches its peak value at 360 nanometers (band gap energy as seen in FIG. 2A) and then remains nearly constant down to 200 nanometers.

Figure 4B:
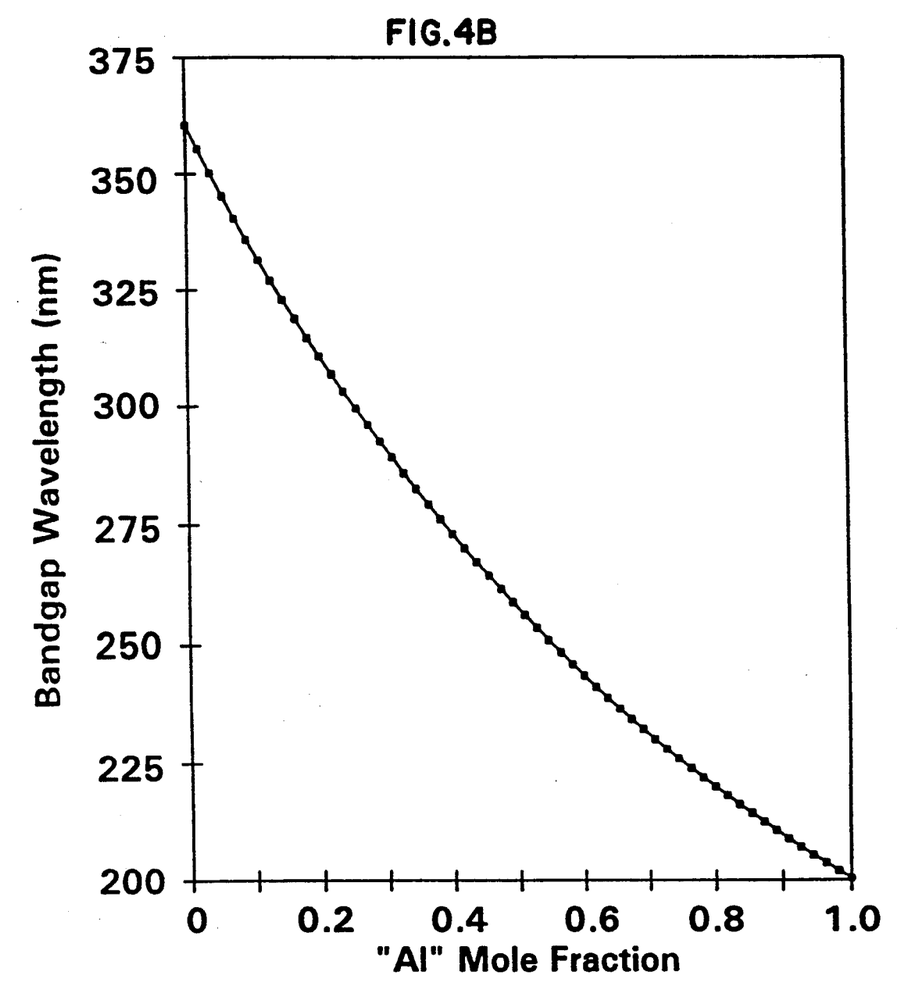
FIG. 4B is a graphical depiction of the variance in band edge with variation in Al content in the $Al_xGa_{1-x}N$ active layer.

By varying aluminum concentration in the active layer (x can range from 0 to 1), the band edge may be varied across the UV range. As seen in FIG. 4B, an aluminum concentration of 0 mole-% provides a band edge of about 365 nm. Meanwhile, an aluminum concentration of 1.0 mole-% provides a band edge of 200 nm.

Figure 4C:
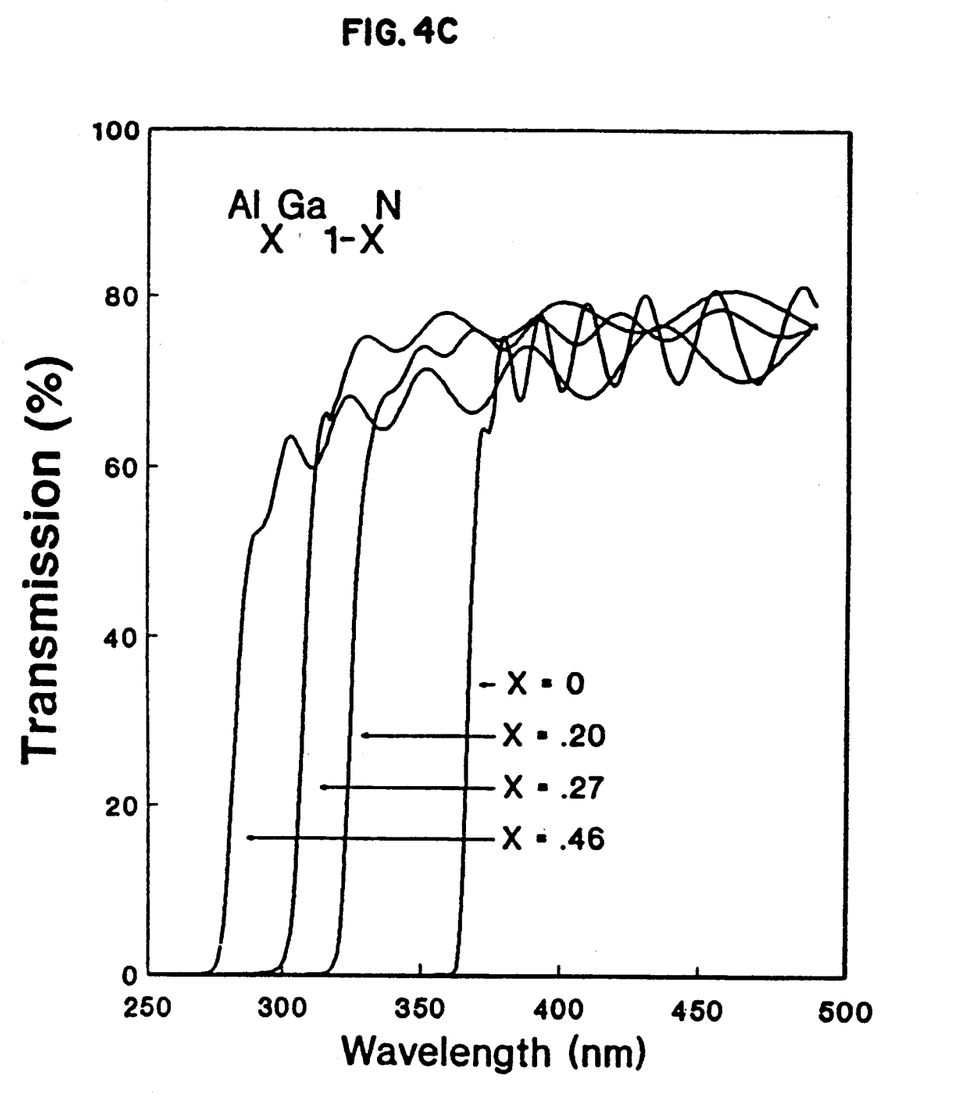
FIG. 4C is a graphical depiction of the optical transmission versus wavelength for several detectors each having a different Al molar concentration.

FIG. 4C illustrates the ability of AlGaN active layer 5 devices to provide varying band edge positioning across the UV spectrum.

Detector Fabrication Process

In fabricating the detector of the invention, a sapphire substrate 1 may be placed on a SiC coated graphite susceptor and heated with rf induction. The matrix layer 3 may then be grown by MOCVD or ALE. Generally, this matrix layer may be grown to a thickness ranging from about 800 Å to 1700 Å. Preferably, the matrix layer of aluminum nitride may be deposited through conventional metal organic chemical vapor deposition (MOCVD) and generally may be deposited in single crystal form.

Preferably, the aluminum nitride is deposited in a two part deposition process. In the first step of the deposition process an aluminum nitride layer ranging in thickness from 300 Å to 700 Å, and preferably 500 Å is deposited at 600° C. through conventional MOCVD processes.

The second phase of the aluminum nitride layer 3 is generally deposited in a thickness ranging from 500 Å to about 1000 Å, and preferably about 700 Å. This deposition is also done through conventional MOCVD processes at temperatures ranging from 950° C. to about 1080° C. and about 1040° C.

Once the AlN layer is grown, a further seed layer 4 of aluminum gallium nitride may be grown. In practice, this gallium nitride layer may be deposited through standard MOCVD processes at 76 torr pressure and at temperatures ranging from about 950° C. to 1080° C. and preferably about 1040° C.

Generally, the active aluminum gallium nitride layer 5 is grown in single crystal through atomic layer epitaxy. The growth temperature generally ranges from about 800° C. and 1000° C. and preferably from about 850° to 950° C. with a growth time which may span up to or over two hours. The growth temperature may be monitored by a thermocouple inserted in the susceptor.

Source gases for gallium include any number of common gallium sources such as trimethyl or triethylgallium. Other source gases include triethylaluminum and for nitrogen, any number of nitrogenous sources including ammonia. Carrier gases may comprise any number of inert gases such as argon and hydrogen. Hydrogen is preferred as it is readily commercially available and generally clean. Growth pressures may range from about 50 torr to 200 torr, and preferably 100 torr.

Preferably, the deposition system is capable of switched operation under computer control. In this mode, the precursors may be introduced in the growth chamber in a cyclic fashion with an adjustable sweepout time between the precursor pulses. The system preferably also allows for a simultaneous introduction of the precursors. One means of using atomic layer epitaxy is to grow the aluminum gallium nitride through a series of pulses or using a switched deposition process. In each of the pulses, lasting approximately one second, a different gas is flowed into the chamber.

For example, in the first pulse, triethylgallium may be flowed into the chamber. In the second pulse, only the carrier gas, for example hydrogen, is flowed into the chamber. In the third pulse, the nitrogenous source, for example ammonia, may be flowed into the chamber. In the fourth pulse, again only an evacuating flow of hydrogen is flowed into the chamber. In the fifth pulse, an aluminum species may be flowed into the chamber. In the sixth pulse, the carrier gas is then used to evacuate the chamber. In the seventh pulse, the nitrogenous source is then introduced into the chamber. In the eighth pulse, the chamber is then evacuated once again. Films of varying aluminum concentration may be deposited by varying the order and number of pulses for each respective gas species.

Preferably, the sequence of steps may be continued over several thousand times resulting in a atomic layer epitaxy process which takes over two hours. As one of skill in the art would expect, variance or extension of this growth period may increase the chemical nature and thickness of the active aluminum gallium nitride single crystal layer.

In completion of the atomic layer epitaxy process, the temperature within the reaction chamber is lowered to range from about 300° C. to 400° C. and held at that temperature for five minutes in a nitrogen flow.

Detector fabrication is completed by covering the active aluminum gallium nitride layer with a photolithographic layer and developing that layer to a pattern such as that shown in FIG. 3. The photolithographic coated upper surface of the active single crystal aluminum gallium nitride layer is then metallized and then the developed photoresist is stripped from the upper surface of the aluminum gallium nitride layer 5, also stripping certain aspects of metallization over the photoresist. The resulting pattern (FIG. 3) acts as a receptor 7 for the ultraviolet detector. One metallization system Applicants have found preferable includes 500 Å of titanium followed by the deposition of 1500 Å of gold.

The detector may then be tested by means known to those of skill in the art.

WORKING EXAMPLES

Applicants now provide working examples which although useful in understanding and demonstrating the device of the invention, should not be construed as limiting of the invention.

Working Example 1

An investigation of photoresponse was undertaken for GaN detectors having the 10 μ wide×20 μm spaced interdigitated finger mask. Interdigitated fingers with 500 Å of titanium and a 2000 Å of gold were deposited on the GaN. The detectors produced excellent results. The fingers were brought to 200 V DC with little leakage current. The detector had an extremely sharp response starting near the band edge of 365 nm. Dies located in the center of the detector are more conductive. However they still have excellent photoresponse. The sample was all sensitive to a cigarette lighter and propane torch at 3 ft. The bias conditions were 200 V DC.

Working Example 2

A UV detector comprising an ALE GaN layer was grown at 150 torr. The films morphology was very grainy. However the film had excellent optical properties. The sample may well be made up of small crystallites of high quality GaN.

As a means of cutting the wafer, a diamond saw was used to cleave the wafer into individual dies.

The detectivity (amps/watt) was measured for the detector as a function of field strength over the spectral range of 320-400 nm using a D.C. power supply of 0-200 volts, an ammeter, and a UV radiation source incident to the detector.

An ammeter was used to measure the detector current at a given wavelength over the range of 320-400 nm. The detectivity of the detector was then determined by dividing the measured current by the total wattage. A small correction was performed since all measured light did not hit the detector. The area of the detector was known and the area of the input light was known and ratioed out. Analysis showed that there was no difference between peak dropoff as a function of voltage.

Four trials were run in each instance detectivity dropped two to three orders of magnitude around 370 nm.

Working Example 3

The detectors 10 of Example 1 were repackaged and detectivity was remeasured. A 4 pin canister 20 (FIGS. 7 and 8) was used to mount the detector 10. The canister top was filed out to allow light input. The dual detector was cut from the die of Working Example 1 by scribing the back with a carbide steel scribe and placing the cut between two protector slides and lightly tapping. The metal fingers were protected during scribing by a coating of photoresist baked on for 45 minutes at 95° C.

Figure 7:
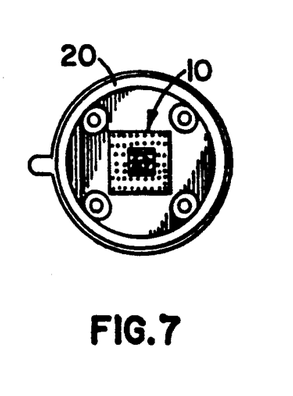
FIG. 7 is a top plan view of a device comprising the detector of the invention.
Figure 8:
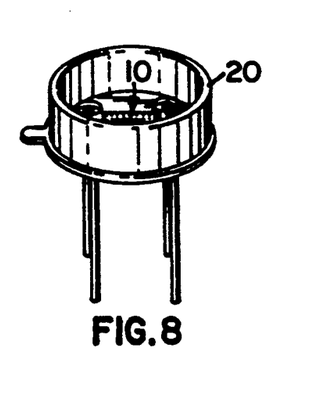
FIG. 8 is a perspective view of the device shown in FIG. 7.

Since the canister 20 was metallic, a piece of glass was bonded onto the pedestal with UV epoxy. The detector was then bonded to the glass with UV epoxy. Wires were attached to the connector wires by attachment to intermediate pads positioned on the glass. A wire was bonded to the pad and ultimately connected to the bonding post. Finally the cap was sealed on with epoxy.

The time response of the UV detector of Example 1 was then measured by pulsing the detector with a nitrogen laser and triggering the scope with the silicon photodiode. The photo-time response appeared to comprise two time constants, one at 1.0 ms and the other on the order of seconds. The laser was adjusted such that at 10 Hz a 10V DC bias existed on the 1 Mega ohm resistor. The rest of voltage was an AC signal with about a 10 ms time constant.

Working Example 4

Another wafer of AlGaN detectors was grown using the method of Example 1. Four samples were cleaved with a 5:5:5:1 minute hot rinse with trichloroethane, acetone, methanol, and propanol. The samples were air dried following the propanol rinse. Approximately 500 Å of titanium was then deposited followed by a 2000 Å of Au. The UV response of the detectors was then measured using a black light excitation source.

| SAMPLE | DIE | V(Bias) | I(Dark) ($\mu$Amps) | I(Photo) ($\mu$Amps) | Response (Seconds) |
|---|---|---|---|---|---|
| A | 1 | 200 | 0.6 | 160 | 3-4 |
| A | 2 | 200 | 2 | >200 | 1-2 |
| A | 3 | 200 | 2 | >100 | 1-2 |
| B | 1 | 200 | 10 | 60 | 3 |
| B | 2 | 200 | 10 | 30 | 3-4 |
| B | 3 | 200 | 10 | 30 | 3-4 |
| B | 4 | 200 | 10 | 20 | 3-4 |
| C | 1 | 200 | 10 | 50 | 1 |
| C | 2 | 200 | 10 | 50 | 1-2 |
| C | 3 | 200 | 10 | >>200 | Fast* |
| D | 1 | 3 | 1 | >>200 | 10 |
| D | 2 | 18 | 1 | >>200 | 10 |
| D | 3 | 5 | 10 | >>200 | 5 |
| E | 1 | 200 | 20 | >200 | Fast* |
| E | 2 | 200 | 15 | >200 | Fast* |
| E | 3 | 200 | 10 | >0.5 | 1 |
| E | 4 | 200 | 10 | >200 | Fast* |
| E | 5 | 200 | 10 | >200 | Fast* |
| E | 6 | 200 | 10 | >200 | Fast* |

*Less than <1 second.

Working Example 5

Using the detector of Working Example 4, detector response was measured using a silicon diode and a spectrometer. The detector of Working Example 4 has a photoresponse similar to that of the detector of Working Example 1. The response dropped 4 orders of magnitude between 365 nm and 370 nm.

Working Example 6

Figure 5:
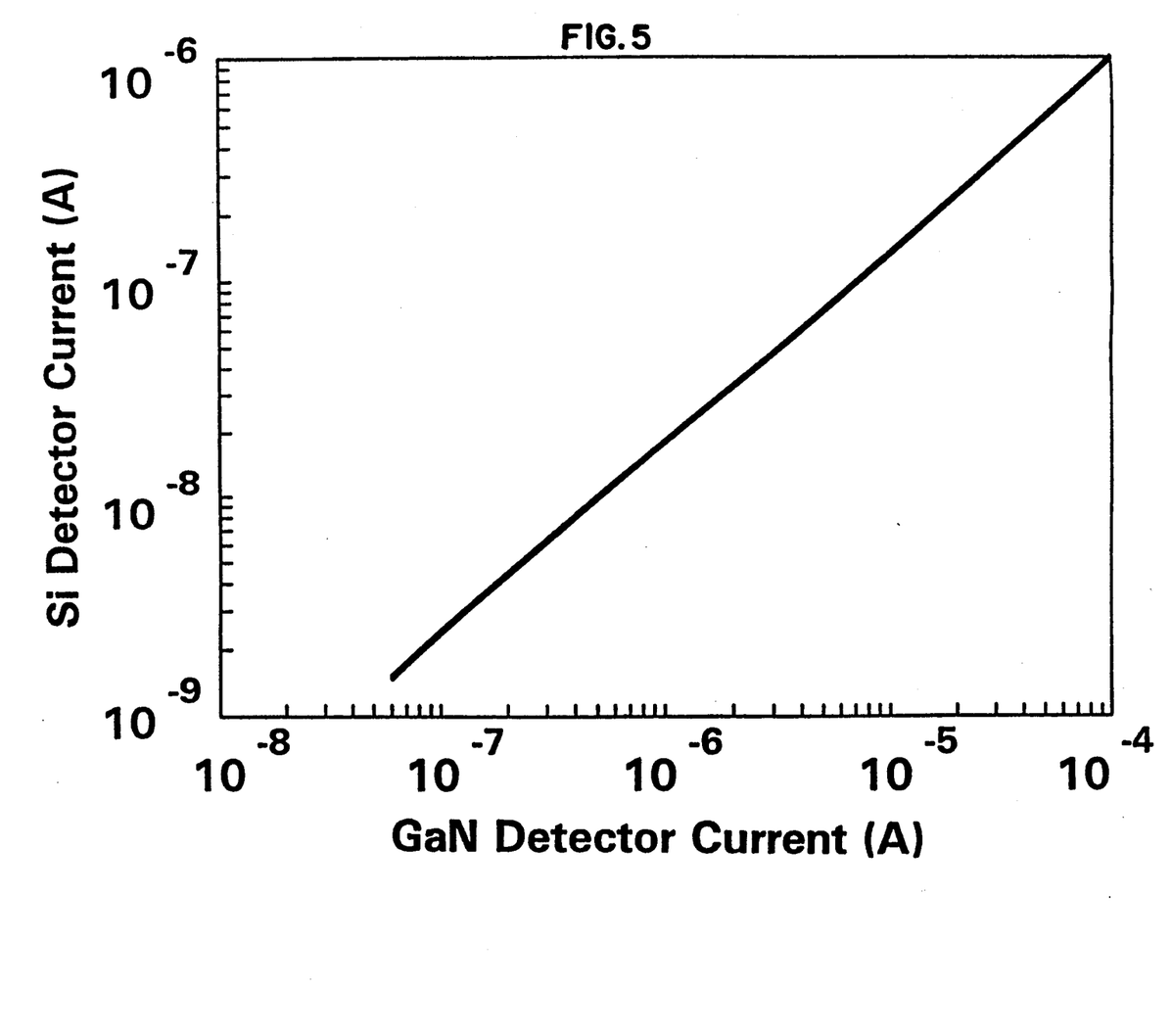
FIG. 5 is a graphical depiction of the detector of the invention compared to conventional silicon detectors.

The peak responsivity of the invention was compared to that from a calibrated silicon detector at a wavelength of 360 nanometers. The silicon detector had an area of 0.95 cm$^2$ as compared to 0.37 mm$^2$ as the exposed area for the GaN detector. FIG. 5 shows the plot of the photosignal measured on the two detectors for the same incident power.

Note, for these measurements the GaN detector had a bias of 5 Volts and a 10 Hz signal was used for each case. As seen the responsivity of the GaN detector is fairly linear over a large dynamic range. Scaling the photocurrent to account for the detector areas, we estimate the peak responsivity of the GaN detector to be around $0.2 \times 10^6$ A/watt. Assuming a quantum efficiency of 0.8 (same as the Si detector) this translates to a gain of around $2 \times 10^6$ A/W.

Figure 6:
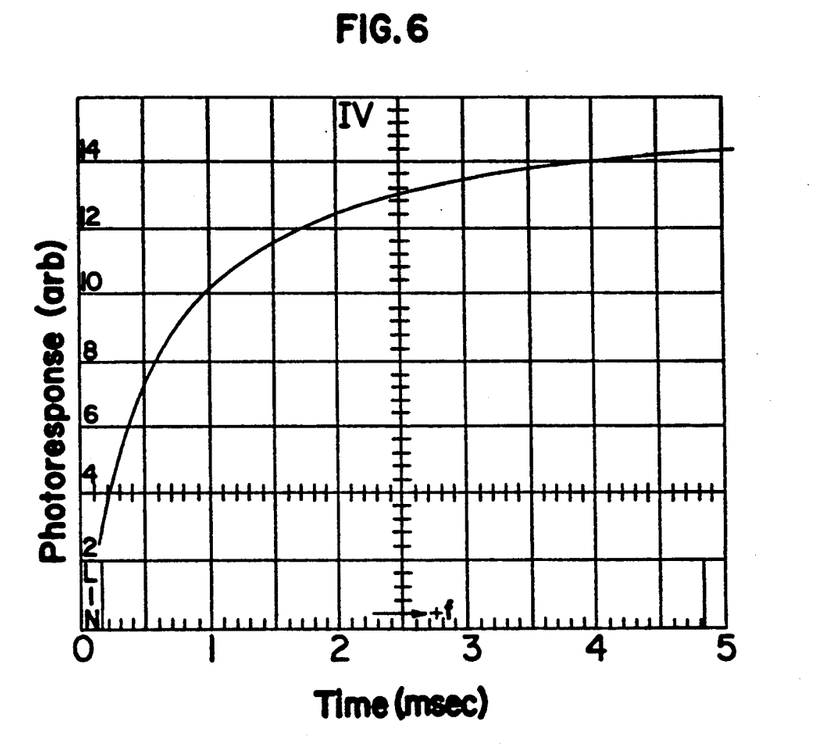
FIG. 6 is a graphical depiction of the photoresponse time of the ultraviolet detector in accordance with the invention.

We also measured the response time of our detectors by using a pulsed UV source, FIG. 6. The time resolved photosignal was measured using an oscilloscope. FIG. 6 is a plot of the signal which shows the response time to be 1 ms.

The above discussion, examples and embodiments illustrate our current understanding of the invention. However, since many variations of the invention can be made without departing from the spirit and scope of the invention, the invention resides wholly in the claims hereafter appended.

We claim as our invention:

1. An ultraviolet photoconductive detector comprising:
   (a) a single crystal substrate;
   (b) a matrix layer deposited over said single crystal substrate, comprising:
      (i) a first layer and
      (ii) a second layer wherein said matrix layer comprises a composition selected from the group consisting of galium nitride, boron nitride, zinc oxide, magnesium oxide, aluminum nitride, and mixtures thereof;
   (c) a single crystal active layer deposited over said matrix layer, said single crystal active layer comprising aluminum gallium nitride; and
   (d) an electrode;
   wherein said ultraviolet photoconductive detector has a peak sensor responsivity at 365 nanometers which is $0.2 \times 10^6$ amps per watt and a substantially constant responsivity for ultraviolet wavelengths ranging from about 200 to 365 nanometers.

2. The detector of claim 1 wherein said active layer has a thickness ranging from about 4000 Å to 20,000 Å.

3. The detector of claim 1 wherein said substrate comprises basal plane sapphire.

4. The detector of claim 1 comprising an aluminum gallium nitride seed layer deposited between said matrix layer and said active layer, said aluminum gallium nitride layer deposited by metal organic chemical vapor deposition.

5. An ultraviolet photoconductive detector comprising:
   (a) a single crystal substrate;
   (b) a matrix layer deposited over said single crystal substrate comprising:
      (i) a first layer and
      (ii) a second single crystal layer;
   (c) a seed layer deposited over said matrix layer, said seed layer comprising aluminum gallium nitride;
   (d) a single crystal active layer deposited over said seed layer, said single crystal active layer comprising aluminum gallium nitride; and
   (e) an electrode.

6. The detector of claim 5 wherein said active layer has a thickness ranging from about 4000 Å to 20,000 Å.

7. The detector of claim 5 wherein said substrate comprises baal plane sapphire.

8. The detector of claim 5 wherein said matrix layer comprises aluminum nitride deposited between said substrate and said active layer.

* * * * *